United States Patent [19]

Miller et al.

[11] Patent Number: 6,094,739
[45] Date of Patent: Jul. 25, 2000

[54] TRELLIS DECODER FOR REAL-TIME VIDEO RATE DECODING AND DE-INTERLEAVING

[75] Inventors: Charles F. Miller, Breinigsville, Pa.; Kalyan Mondal, Berkeley Heights; James C. Lui, Bedminster, both of N.J.

[73] Assignee: Lucent Technologies, Inc., Murray Hill, N.J.

[21] Appl. No.: 08/936,316

[22] Filed: Sep. 24, 1997

[51] Int. Cl.[7] .................................................. G06F 11/00
[52] U.S. Cl. ......................... 714/792; 714/795; 714/796
[58] Field of Search .................................. 714/792, 786, 714/746, 791, 795, 796, 794, 790, 752, 780; 375/265, 261, 260, 259; 395/251; 704/242, 236, 231, 200

[56] References Cited

U.S. PATENT DOCUMENTS

| | | | |
|---|---|---|---|
| 5,422,894 | 6/1995 | Abe et al. | 714/775 |
| 5,446,746 | 8/1995 | Park | 375/341 |
| 5,490,178 | 2/1996 | Blaker | 375/341 |
| 5,508,752 | 4/1996 | Kim et al. | 348/608 |
| 5,530,707 | 6/1996 | Lin | 375/341 |
| 5,533,065 | 7/1996 | Blaker et al. | 375/341 |
| 5,742,622 | 4/1998 | Claydon et al. | 714/790 |
| 5,838,729 | 11/1998 | Hu et al. | 375/265 |
| 5,841,478 | 11/1998 | Hu et al. | 348/426 |
| 5,844,947 | 12/1998 | Cesari | 375/341 |
| 5,862,190 | 1/1999 | Schaffner | 375/341 |

OTHER PUBLICATIONS

B. Honary; L. Kaya; G.S. Markarian; M. Darnell; Maximum–Likelihood Decoding of Array Codes with Trellis Structure; IEE Proceedings–I, vol. 145, No. 5, Oct. 1993.

C. Shung; H. Lin; R. Cypher; P. Siegel; H. Thapar; Area–Efficient Architectures for the Viterbi Algorithm –Pary I: Theory; IEEE Transactions on Communications; vol. 41; No. 4, Apr. 1993.

R. Cypher; C. Chung; Generalized Trace Back Techniques for Survivor Memory Management in the Viterbi Algorithm; Proceedings of GlobeCom, IEEE Press, Dec. 1990.

Primary Examiner—Albert De Cady
Assistant Examiner—Jason Greene

[57] ABSTRACT

A Trellis decoder allows for real time decoding of high rate input data more than 10 MHz, with a compact layout and without the need to generate very high speed clocks, by use of a branch metric generator feeding multiple parallel Add/Compare/Select modules, which in turn feed a traceback processor using pre-traceback shift registers and traceback memory. The decoder performs n-state Trellis decoding in real time while simultaneously de-interleaving a multiplexed data stream. The architecture can be expanded to provide programmable length traceback in a fixed number of clock cycles. The invention performs de-interleaving in parallel with the Trellis decoding, and symbols coming out of the decoder need no further processing for de-interleaving. Moreover, the invention allows complete traceback in one symbol period at video rates without the need for very high speed clocks or multi-read port memories. Programmability allows for flexible tradeoff of output error rate and traceback memory space.

14 Claims, 7 Drawing Sheets

TRELLIS DECODER FOR REAL-TIME VIDEO RATE DECODING AND DE-INTERLEAVING

FIELD OF THE INVENTION

The invention pertains to the field of decoding digital data. More particularly, the invention pertains to real-time decoding of high-speed trellis-encoded digital data.

BACKGROUND OF THE INVENTION

In many data processing applications, it is often desirable to encode a data stream using trellis codes or other data encoding techniques. Trellis codes are a general class of convolutional codes in which state transitions may be diagrammed in the form of a trellis, but which do not necessarily exhibit shift register-like characteristics. For example, in digital communication systems, trellis coding of modulation data, when combined with an appropriate mapping of the encoded data to a transmitted signal set, can improve the performance of a receiver without an increase in transmitted signal power or bandwidth. The equivalent signal-to-noise improvement attributable to data encoding is referred to as coding gain, and results in increased bandwidth and power efficiency.

As a result, Trellis decoders are included in many products including modems, cellular phones, and satellite receivers. These applications are relatively slow-speed, however, compared with the demands of digital video data streams, which require decoding at a rate of 10 MHz or greater.

Figure 1:
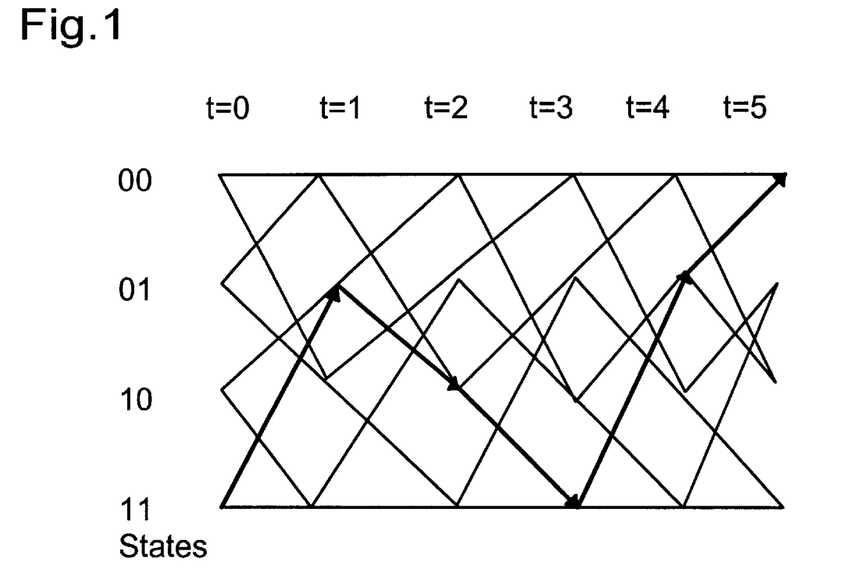
FIG. 1 shows a transition diagram (trellis) encoder with two registers and four possible states.

A convolutional encoder is a finite state machine in which evolution is controlled by the succession of bits in the message. For each coding cycle, information is generated by the encoder concerning the evolution of its internal state. The decoder searches for the most likely evolution of the encoder as a function of the arriving information. An example of an encoder is a simple shift register of length $\upsilon$, which receives the bits $u_0, u_1, \ldots, u_n$ to be transmitted. The contents of the $\upsilon$ registers represents the $2^\upsilon$ possible states. The succession of encoder states is usually represented by a path in the transition diagram (trellis) of the encoder as shown in FIG. 1. FIG. 1 shows an example of a trellis for $\upsilon=2$. The bold path indicates the succession of encoder states at times t=0 to 5. The message bit which changes the encoder state between t=i and t=i+1 is indicated on the corresponding branch. For example, the arrival of a "1" in the shift register changes the state of the encoder at t=1, 01, to 10 at t=2.

At each decoding cycle, the decoder receives information on the encoder transition. The most likely previous state among the $2^\upsilon$ possible states is usually determined by the branch metric unit and by the Add/Compare/Select (ACS) unit. Each node of the trellis is associated with a path called the "surviving path." All surviving paths are converging towards a unique path provided that the number of successive branches is equal to or greater than a convergence length L. This unique path is the decoded message.

One technique for managing the surviving memory is called "traceback." A node is chosen at random and its surviving path is followed on a depth of L+H in order to obtain H decoded states. The main advantage of traceback is the very dense storage of the decision vectors in memories. Disadvantages include a large decoding delay as well as having to store a large number of decision vectors.

Existing Trellis decoders have at least three problems when used in connection with very fast real-time data streams such as video information, which this invention addresses:

1) At video rates, many calculations must be performed for each input symbol without the benefit of a fast rate clock as in voice/data modems. This makes real-time decoding of video data more difficult than voice or data.

2) Data can be interleaved through multiple Trellis encoders to reduce the effect of burst noise on the received data. This means that additional processing is required on the data stream after Trellis decoding to perform de-interleaving.

3) The absence of a fast clock in a video application makes deep traceback difficult because there is a very limited number of traceback memory accesses possible during each symbol period. Techniques such as pre-traceback and multiple-symbol decoding are commonly used to address this problem.

Lin, "Area Efficient Decoders for Rate-k/n Convolutional Codes and Other High Rate Trellis Codes", U.S. Pat. No. 5,530,707, issued Jun. 25, 1996, represents one prior-art high speed trellis decoder.

SUMMARY OF THE INVENTION

The Trellis decoder of the invention allows for real time decoding of high rate input data more than 10 MHz with a compact layout and without the need to generate very high speed clocks, by use of a branch metric generator feeding multiple parallel Add/Compare/Select modules, which in turn feed a traceback processor using pre-traceback shift registers and traceback memory. The decoder performs n-state Trellis decoding in real time while simultaneously de-interleaving a multiplexed data stream. The architecture can be expanded to provide programmable length traceback in a fixed number of clock cycles. The invention performs de-interleaving in parallel with the Trellis decoding. In HDTV applications, the invention includes an internal sequencer that restores the symbol byte order to its pre-interleaved state. Data coming out of the decoder need no further processing for de-interleaving. Moreover, the invention allows complete traceback in one symbol period at video rates without the need for very high speed clocks or multi-read port memories. Programmability would allow for flexible tradeoff of output error rate and traceback memory space.

Referring to the three problems with existing decoders discussed in the "Background" section, above, the decoder of the invention:

1) provides a fast method for computing the shortest branch metric Euclidean distance for an HDTV application;

2) handles the calculations to update the path metrics by using multiple independent Add/Compare/Select (ACS) modules. A data shuffler coordinates data transfer between the ACS modules and the associated path metric memories;

3) handles de-interleaving in parallel with decoding by segmenting the path metric and traceback memories and performing multiple trellis decodes in parallel, so that the output of the decoder is already de-interleaved and re-sequenced to the correct order so that no data processing is required downstream; and 4) uses a pre-traceback architecture which is easily convertible to a programmable depth, so that, when used in an application where the traceback memory is shared with other processors, it would allow for adjustable traceback depth tailored to the desired output error rate and local memory resources.

The invention is a Trellis Decoder especially useful for decoding data at video rates 10 Mhz. The decoder performs 12:1 de-interleaving of the data stream as it decodes. The decoder can process the data in real time even though the fastest clock available is only 4× the data input rate. Pre-traceback allows for a 16 deep traceback to be performed in only 4 traceback memory accesses. With minor variations, this design could be programmed to traceback from 4 to 32 symbols deep in the same four memory accesses.

DESCRIPTION OF THE PREFERRED EMBODIMENT

Figure 2:
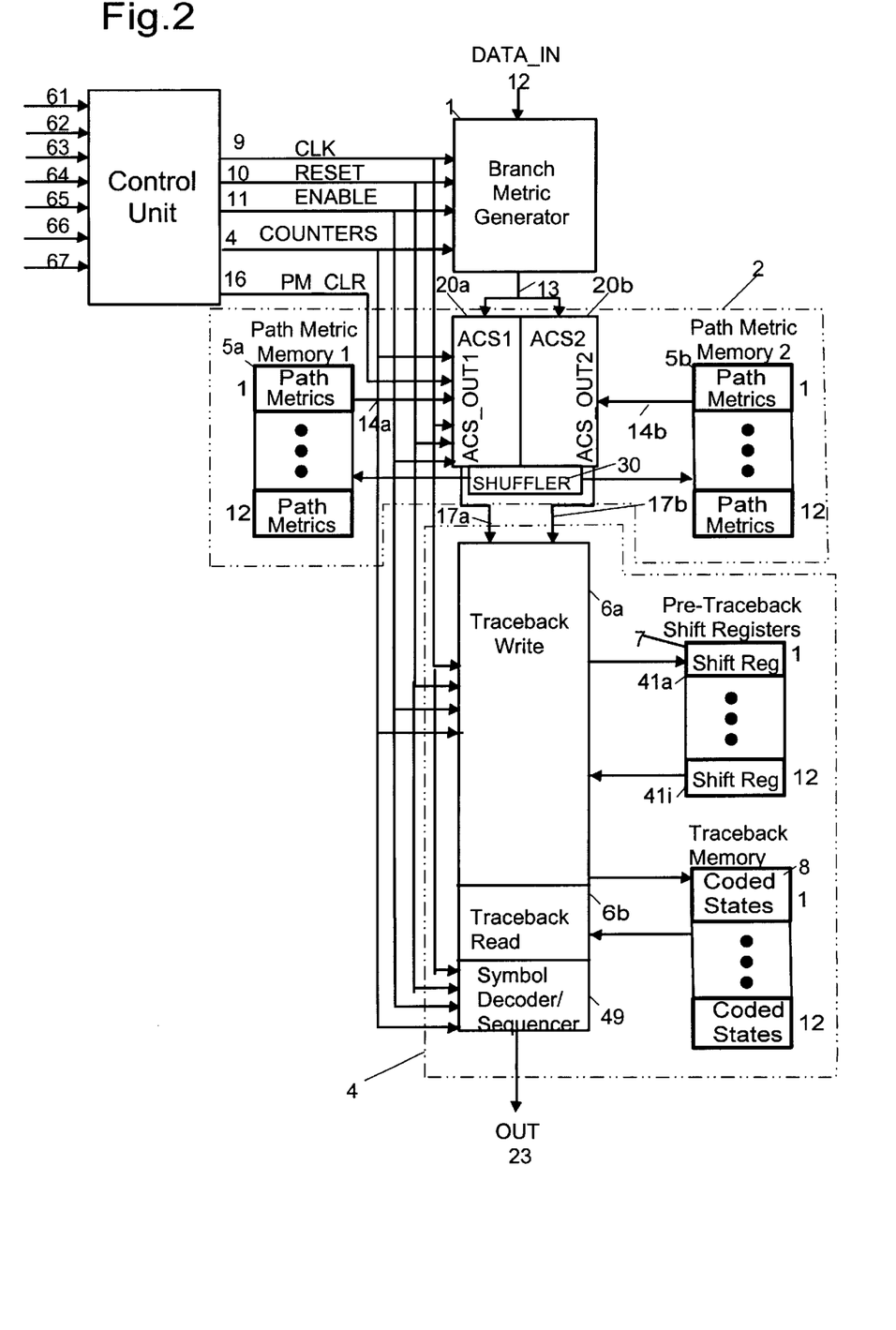
FIG. 2 shows an overall block diagram of the decoder of the invention.

Referring to FIG. 2, the Trellis Decoder includes a branch metric generator 1, which generates a plurality of branch metric values 13 from an input data stream 12. An ACS (Add/Compare/Select) module includes a number of ACS modules 20a, 20b for computing a plurality of path metric values 14a, 14b which are stored in an associated path metric memory 5a, 5b. A traceback processor 6 includes a traceback write portion 6a and a traceback read portion 6b. Traceback processor includes a plurality of associated pre-traceback shift registers 41a–i and a traceback memory 8. Traceback processor 6 outputs a symbol output 23, which is the output of the decoder.

A control unit 2 of the Trellis Decoder takes the following signals as external inputs: a CLK signal 61, a field_sync signal 62, a segment_sync signal 63, a data_valid signal 64, a data_symbol signal 65, a reset signal 66, and a state_mode signal 67. Control unit 2 directs the flow of data among the internal units of the Trellis Decoder. The decoder performs all of its operations at a single clock frequency provided by CLK signal 61. For example, an HDTV application uses a clock frequency of 43.04 MHz. Field_sync signal 62 and segment_sync signal 63 provide a data framing structure for the HDTV application. Data_valid signal 64 signals which piece of data should be operated on by the decoder since the clock frequency of CLK signal 61 typically exceeds the incoming symbol rate. Reset signal 66 is used to place the decoder in a predetermined state prior to startup. State_mode signal 67 informs the decoder whether it should operate in a 4-state or 8-state HDTV mode.

The outputs of control unit 2 are distributed to various internal units of the decoder as shown in FIG. 2. A CLK output 9 distributes the clock signal as shown. A RESET output 10 passes on reset signal 66 to initialize the decoder at startup. An enable output 11, which may consist of multiple signals, determines when each individual unit should operate or stop operating on its own data. A PM_CLR output 16 provides a means of clearing path metric memories 5a, 5b prior to the real decoding operation. Control unit 2 distributes a plurality of counter signals to the other internal units of the decoder via a COUNTER output 4 to synchronize the operations of the internal units.

Because of the high speed symbol rate, multiple ACS modules are used. It will be understood that, while for simplification and space reasons only two ACS modules 20a and 20b, and associated path metric memories 5a and 5b are shown in this figure, any convenient number may be used within the teachings of the invention, and the other figures show an arbitrary number of ACS modules. For example, for the HDTV application, the number m of ACS modules and path metric memories equals 2.

Figure 6:
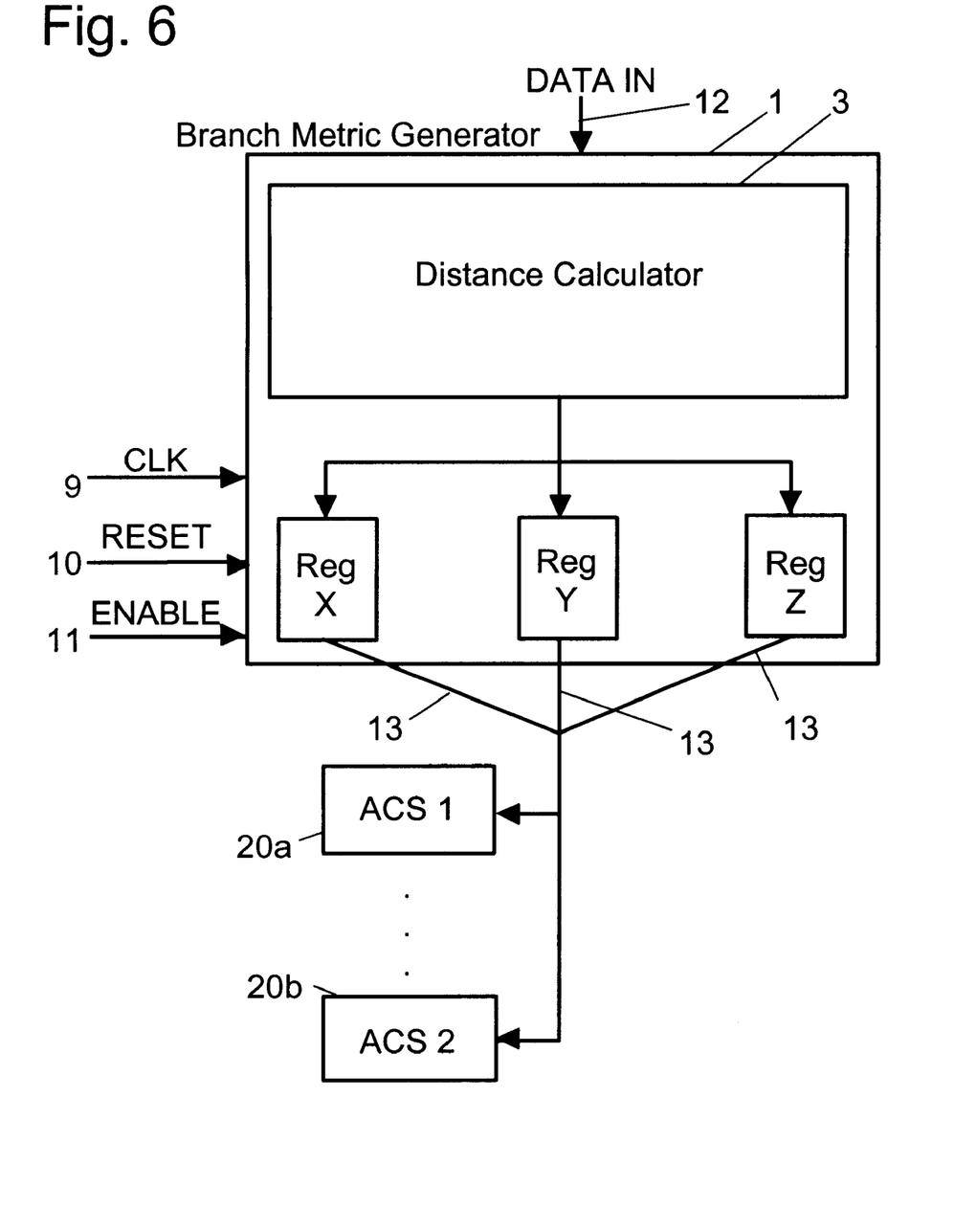
FIG. 6 shows a detail block diagram of a branch metric generator for an HDTV application.

Referring now to FIG. 6, interleaved, Trellis encoded data—DATA_IN 12—is passed into branch metric generator 1, once per symbol period. The distance to each predicted subset is calculated and stored. Data passes to a distance calculator 3 which calculates squared distance to expected values. For example, in the HDTV design, two modes, 8-state and 4-state, are both handled by the same hardware design. The expected values for the 8-state and 4-state modes are shown (hex representations above decimal representations) in Table 1.

TABLE 1

| 4-state | 0x90 |  | 0xB0 |  | 0xD0 |  | 0xF0 |  | 0x10 |  | 0x30 |  | 0x50 |  | 0x70 |
|---|---|---|---|---|---|---|---|---|---|---|---|---|---|---|---|
|  | −7 |  | −5 |  | −3 |  | −1 |  | 1 |  | 3 |  | 5 |  | 7 |
| 8-state | 0x90 | 0xA0 | 0xB0 | 0xC0 | 0xD0 | 0xE0 | 0xF0 | 0x00 | 0x10 | 0x20 | 0x30 | 0x40 | 0x50 | 0x60 | 0x70 |
|  | −14 | −12 | −10 | −8 | −6 | −4 | −2 | 0 | 2 | 4 | 6 | 8 | 10 | 12 | 14 |

For the 8-state mode, the fifteen expected symbols are partitioned into seven subsets of values named A, B1, B2, C2, C2, D1, and D2. For the 4-state mode, the eight expected symbols are partitioned into four subsets of values named A, B, C, and D.

Two minimum subset distances are calculated every clock cycle and loaded into three registers X, Y, and Z. A third value is available after cycle 1 because previously calculated distances are used by ACS 20a–20b in more than 1 clock cycle. A minimum subset distance is defined as the smallest squared difference out of all the possible ones between the incoming symbol value and a member in the subset.

Figure 9A:
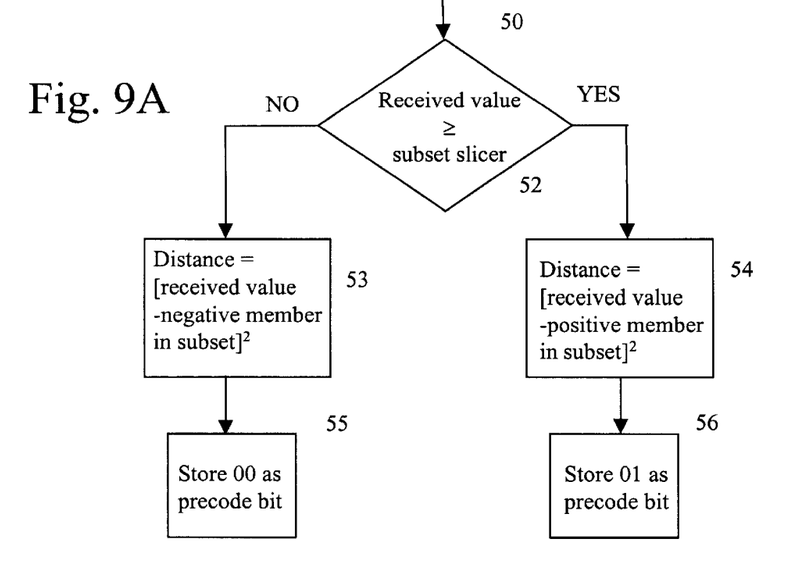
FIG. 9A shows a flow chart of a fast process for determining the minimum subset distances in the 4-state mode for the HDTV application.
Figure 9B:
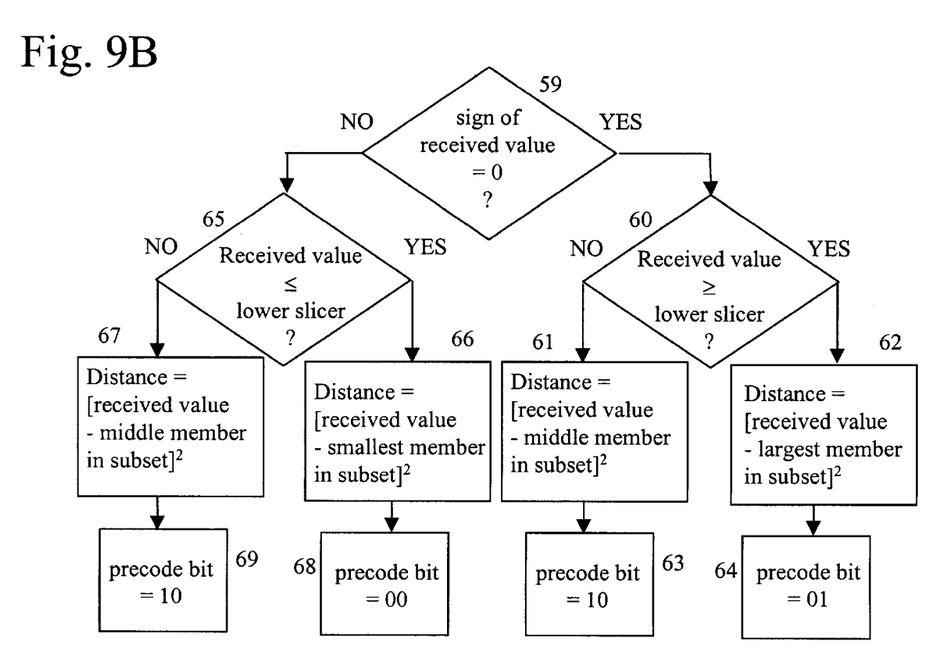
FIG. 9B shows a flow chart of a fast process for determining the minimum subset distances in the 8-state mode for the HDTV application.

Referring to FIGS. 9A–9B, a fast process for determining the minimum Euclidean distance in distance calculator 3 is applicable to general trellis decoders. The specific values shown are specifically used for the HDTV application. This process differs from traditional methods in that it needs to calculate the distance only once per subset instead of (a) computing the distance for each member in the subset and then (b) comparing all the possible distances to decide which is the smallest.

In the 4-state mode of FIG. 9A, there are four subsets to evaluate named A, B, C, and D. The members (values) in each subset, along with the slicer values, are:

$A=\{1, -7\} \rightarrow \text{slicer}=-3$ $B=\{3, -5\} \rightarrow \text{slicer}=-1$ $C=\{5, -3\} \rightarrow \text{slicer}=+1$ $D=\{7, -1\} \rightarrow \text{slicer}=+3$ The subset slicer values above are defined as the average of the two values in the subset. The precode bits are used in symbol decoder/sequencer 49 to recover the transmitted symbols. A received value 50 is the 8-bit 2's complement input signal of input data stream 12 going to branch generator 1 shown in FIG. 2.

Received value 50 is compared to the subset slicer in step 52. As shown in step 54, if received value 50 is greater than or equal to the subset slicer value, the distance is the square of the difference between the received value and the positive number in the subset. The precode bit is stored as 01 in step 56. On the other hand, as shown in step 53, if received value 50 is less than the subset slicer value, the distance is the square of the difference between the received value and the negative number in the subset. The precode is then stored in step 55 as 00.

In the 8-state mode shown in FIG. 9B, there are seven values to evaluate named A, B1, B2, C1, C2, D1, and D2.

The members (values) in each subset, along with the slicer values, are:

$A=\{8, 0, -8\} \rightarrow \text{upper\_slicer}=4; \text{lower\_slicer}=-4$ $B1=\{10, 2, -6\} \rightarrow \text{upper\_slicer}=6; \text{lower\_slicer}=-2$ $B2=\{2, -6, -14\} \rightarrow \text{upper\_slicer}=-2; \text{lower\_slicer}=-10$ $C1=\{12, 4, -4\} \rightarrow \text{upper\_slicer}=8; \text{lower\_slicer}=0$ $C2=\{4, -4, -12\} \rightarrow \text{upper\_slicer}=0; \text{lower\_slicer}=-8$ $D1=\{14, 6, -2\} \rightarrow \text{upper\_slicer}=10; \text{lower\_slicer}=2$ $D2=\{6, -2, -10\} \rightarrow \text{upper\_slicer}=2; \text{lower\_slicer}=-6$ There are two slicer values for each of the subsets in the 8-state mode. The upper slicer values above are defined as the average of the two largest values in the subset. The lower slicer values above are defined as the average of the two smallest values in the subset. The sign of received value 50 referred to in the 8-state mode is the most significant bit (MSB) of received value 50.

The sign of received value 50 is checked to see if it is zero in step 59. If the sign is zero, the received value is compared to the subset upper slicer in step 60. As shown in step 62, if received value 50 is greater than or equal to the upper slicer value, the distance is the square of the difference between the received value and the largest member in the subset. The precode bit is stored as 01 in step 64. As shown in step 61, if received value 50 is less than the subset upper slicer value, the distance is the square of the difference between the received value and the middle member in the subset. The precode is then stored in step 63 as 10.

If the sign in step 59 is not zero, the received value is compared to the subset lower slicer in step 65. As shown in step 66, if received value 50 is less than or equal to the lower slicer value, the distance is the square of the difference between the received value and the smallest member in the subset. The precode bit is stored as 00 in step 68. As shown in step 67, if received value 50 is greater than the subset lower slicer value, the distance is the square of the difference between the received value and the middle member in the subset. The precode is then stored in step 69 as 10.

These distance values, called "branch metrics" and shown as branch metrics 13 in the figure, are used in ACS 20*a*–20*b* to calculate the path metrics. The 4-state mode can be calculated with the same hardware by changing the values calculated in distance calculator 3. Table 2 shows the output of registers X, Y, and Z.

TABLE 2

| Clock Cycle | 1 | 2 | 3 | 4 |
|---|---|---|---|---|
| 8-STATE MODE ($BM_A$ = Branch Metric to closest value in subset A) | | | | |
| Reg X | $BM_A$ | $BM_{C1}$ | $BM_{D1}$ | $BM_{B1}$ |
| Reg Y | $BM_{C2}$ | $BM_A$ | $BM_{B1}$ | $BM_{D2}$ |
| Reg Z | Unused | $BM_{B1}$ | $BM_{D2}$ | $BM_{B2}$ |
| 4-STATE MODE | | | | |
| Reg X | $BM_A$ | $BM_C$ | $BM_D$ | $BM_B$ |
| Reg Y | $BM_C$ | $BM_A$ | $BM_B$ | $BM_D$ |
| Reg Z | Unused | Unused | Unused | Unused |

Figure 3:
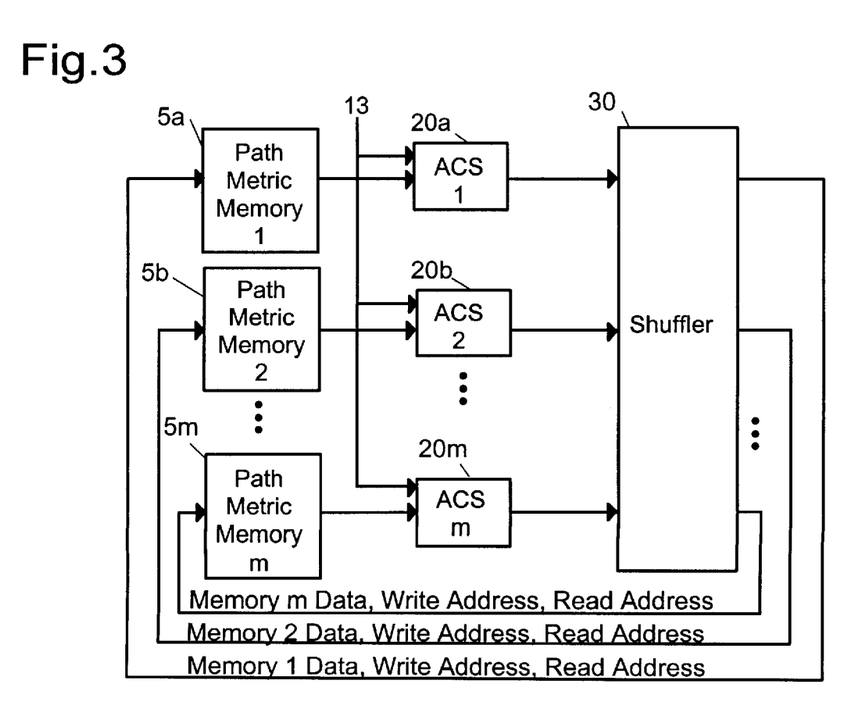
FIG. 3 shows a detail block diagram of an ACS (Add/Compare/Select) module of the invention, showing the multiple path metric processors.

The data in registers X, Y, and Z are used in ACS 20*a*–20*b* to do the calculations shown in Table 3 (8-state mode for HDTV) and Table 4 (4-state mode for HDTV). Table 3 relates to FIG. 7 and Table 4 relates to FIG. 8. There are two ACS modules and two path metric memories in the HDTV design. The number of modules and associated memories can be expanded for other applications as shown in FIG. 3. The 4-state ACS can be performed by the same hardware as the 8-state by simply rearranging the data in the path metric memories.

TABLE 3

| Clock Cycle | 8-STATE MODE | |
|---|---|---|
| | ACS 1 | ACS 2 |
| 1 | $BM_A + PM_0$ <br> $BM_{C2} + PM_1$ ⟩ $PM_0$ | $BM_A + PM_6$ <br> $BM_{C2} + PM_7$ ⟩ $PM_6$ |
| 2 | $BM_{C1} + PM_0$ <br> $BM_A + PM_1$ ⟩ $PM_3$ | $BM_{C1} + PM_6$ <br> $BM_A + PM_7$ ⟩ $PM_5$ |
| 3 | $BM_{D1} + PM_2$ <br> $BM_{B1} + PM_3$ ⟩ $PM_7$ | $BM_{B1} + PM_4$ <br> $BM_{D2} + PM_5$ ⟩ $PM_1$ |

TABLE 3-continued

| Clock | 8-STATE MODE | |
|---|---|---|
| Cycle | ACS 1 | ACS 2 |
| 4 | $BM_{B1} + PM_2$ <br> $BM_{D2} + PM_3$ $\rangle PM_4$ | $BM_{D2} + PM_4$ <br> $BM_{B2} + PM_5$ $\rangle PM_2$ |

Where $BM_A$=Branch Metric to closest value in subset A;
$PM_0$=Path Metric to state 0;
and $$\begin{array}{c} BM_A + PM_0 \\ BM_{C2} + PM_1 \end{array} \rangle PM_0$$

Choose smallest of the two sums and assign it to $PM_0$.

TABLE 4

| Clock | 4-STATE MODE | |
|---|---|---|
| Cycle | ACS 1 | ACS 2 |
| 1 | $BM_A + PM_0$ <br> $BM_C + PM_2$ $\rangle PM_0$ | Unused |
| 2 | $BM_C + PM_0$ <br> $BM_A + PM_2$ $\rangle PM_1$ | Unused |
| 3 | $BM_D + PM_3$ <br> $BM_B + PM_1$ $\rangle PM_2$ | Unused |
| 4 | $BM_B + PM_3$ <br> $BM_D + PM_1$ $\rangle PM_3$ | Unused |

Where $BM_A$=Branch Metric to closest value in subset A;
$PM_0$=Path Metric to state 0;
and $$\begin{array}{c} BM_A + PM_0 \\ BM_C + PM_2 \end{array} \rangle PM_0$$

Choose smallest of the two sums and assign it to $PM_0$

Figure 7:
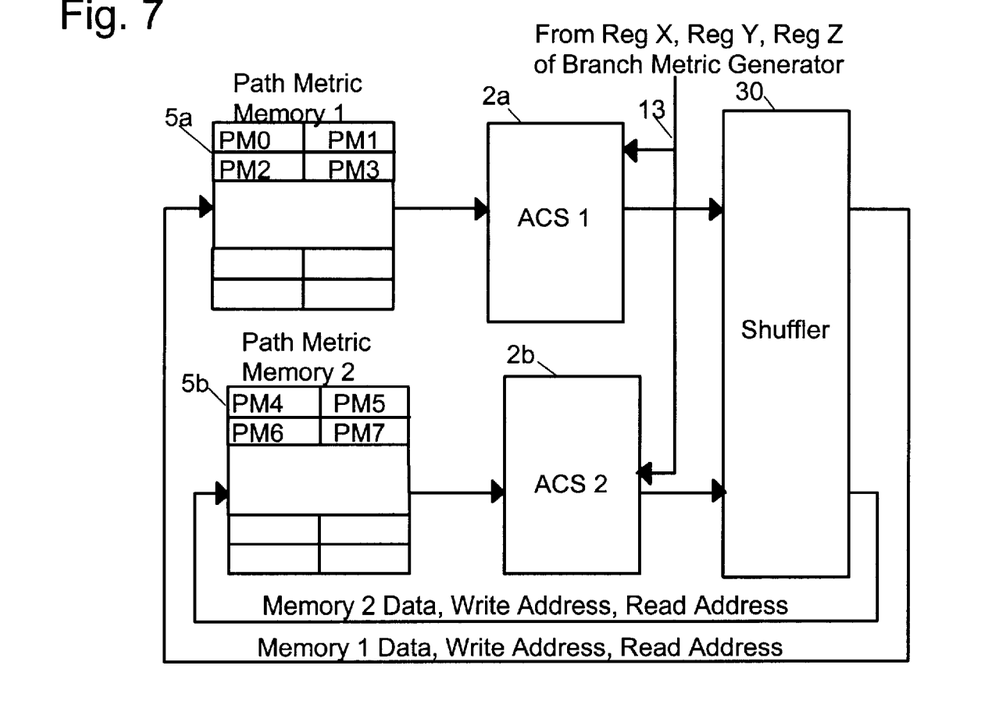
FIG. 7 shows a detail block of the path metric memory data and ACS and shuffler operation for an 8-state mode Trellis Decoder for an HDTV application.
Figure 8:
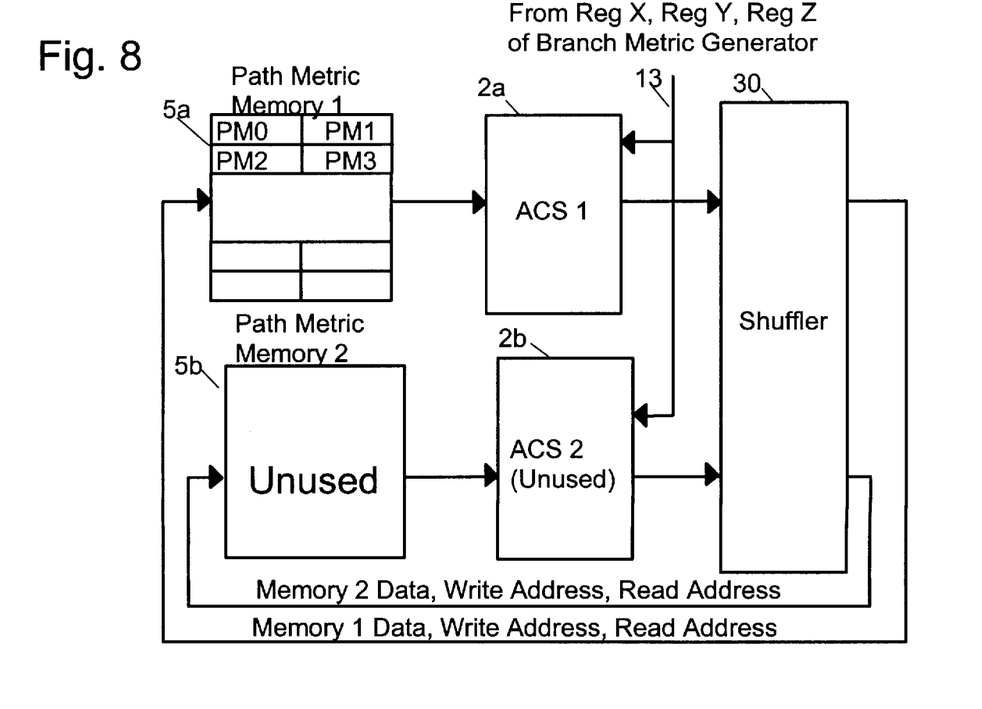
FIG. 8 shows a detail block of the path metric memory data and ACS and shuffler operation for a 4-state mode Trellis Decoder for an HDTV application.

Referring to FIGS. 6–7, branch metric values 13 are passed to ACS modules 20a, 20b. A data shuffler 30 coordinates data transfer between ACS modules 20a, 20b and the associated path metric memories 5a, 5b. ACS modules 20a, 20b pass the smallest calculated path metric values to shuffler 30 which are then reloaded into path metric memories 5a, 5b. Shuffler 30 decides which memory is appropriate based on the path metric calculations which are specific to a particular application. The path metric calculations for the HDTV case are shown in FIG. 7 (8-state) and FIG. 8 (4-state). The scheduling of the 8-state path metric calculations together with the ordering of the path metric values in path metric memories 5a, 5b determines the design for shuffler 30. The 4-state mode can be accommodated with the same shuffler and the same ACS modules as used for the 8-state mode by simply reordering the data in the path metric memories as shown in FIG. 8.

Referring back to FIG. 2, each ACS module 20a, 20b passes n bits to a traceback logic 6 every clock cycle. These n bits inform traceback logic 6 which of two possible path metric sums is the smallest as well as what input raw data are likely to have caused the current trellis transition. For the HDTV application, n=2 for the 4-state mode and n=3 for the 8-state mode. Since there are four clock cycles for every data input to the Trellis Decoder in the HDTV application, up to 24 significant (2×4×3) bits of data are passed to traceback logic 6 for every data input to the Trellis Decoder. This architecture can be expanded for other applications, with different shuffler designs as necessary, as shown in FIG. 4.

Figure 4:
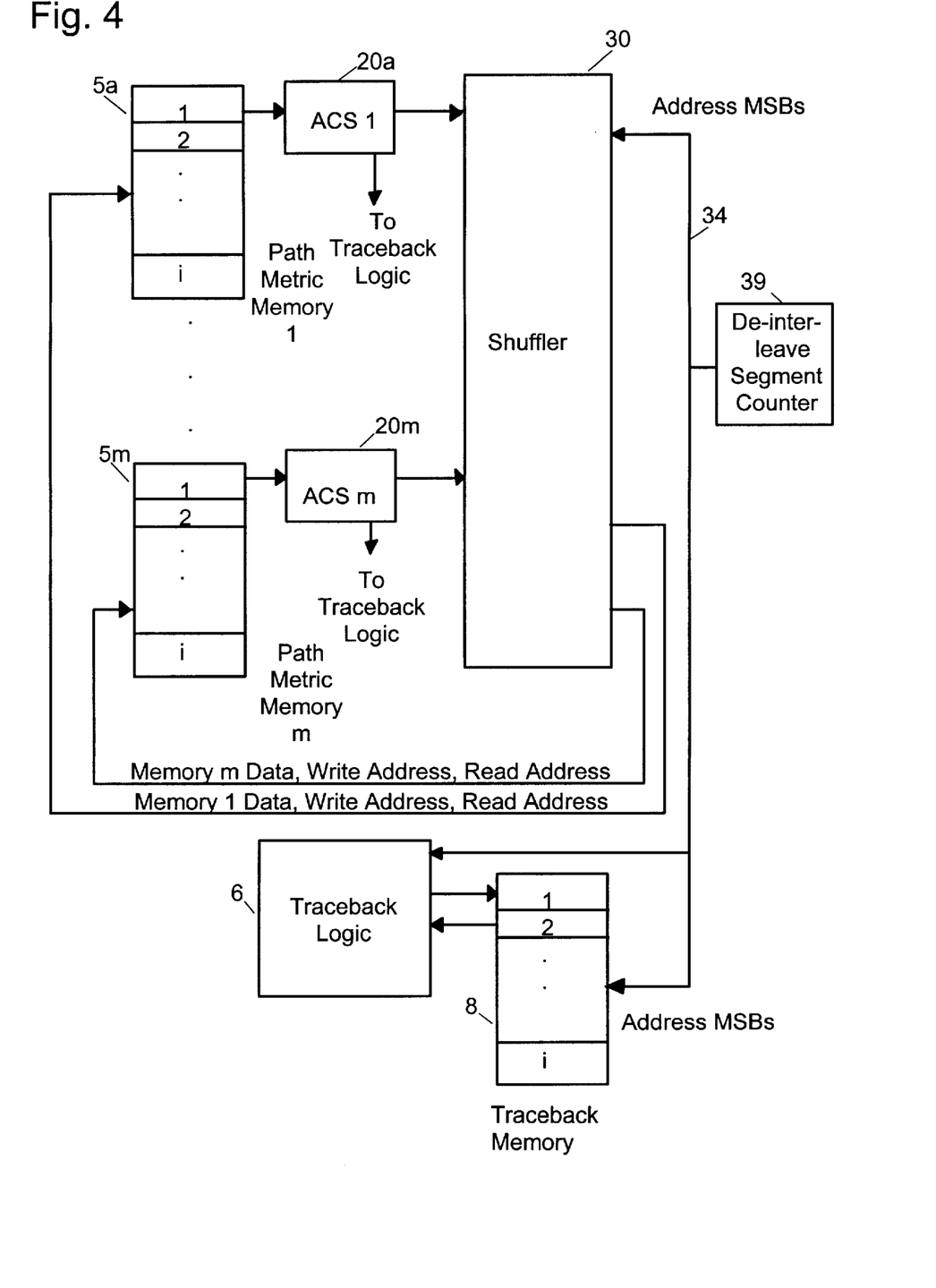
FIG. 4 shows a detail block diagram of the path metric and traceback memory segmentation used in a generic design of the invention.

Referring to FIG. 4, for a 12:1 interleave as used in the HDTV application, twelve separate sets of path metrics are maintained in parallel through segmentation of path metric memories 5a–5m. That is, for the HDTV application, i=12 and m=2, where i is the de-interleave depth and m is the number of ACS modules and path metric memories. Values of i and m are usually different for applications other than an HDTV Trellis Decoder. A de-interleave counter 39 increments the working segment space once every symbol period in modules of i. In the HDTV application, special provisions are made to account for the segment synchronization transitions at which the de-interleave counter changes by a count of 4 rather than 1. This cycling of path metric memory space makes up half of the built-in de-interleaving. In the 8-state mode, both halves are required (FIG. 7), whereas in the estate mode, only one half is required (FIG. 8). If both memories are being used to calculate path metrics, then both must be de-interleaved with de-interleave counter 39 simultaneously.

Traceback memory 8 is also segmented into twelve equal sections so that twelve traceback sequences are maintained in parallel. The same de-interleave counter 39 used for path metric memories 5a–5m is used to point to the appropriate traceback memory 8 space. This cycling of traceback memory space makes up the second half of the de-interleaving.

Referring back to FIG. 2, branch metric values 13 are passed to ACS modules 20a, 20b where a plurality of path metric values 17a, 17b are computed as previously described. Previous path metric values 14a, 14b are retrieved from path metric memories 5a, 5b. As shown in FIG. 3, these values are used in the calculation of the new path metrics, which are sorted by shuffler 30 and passed to the appropriate path metric memory 5a–m.

Figure 5:
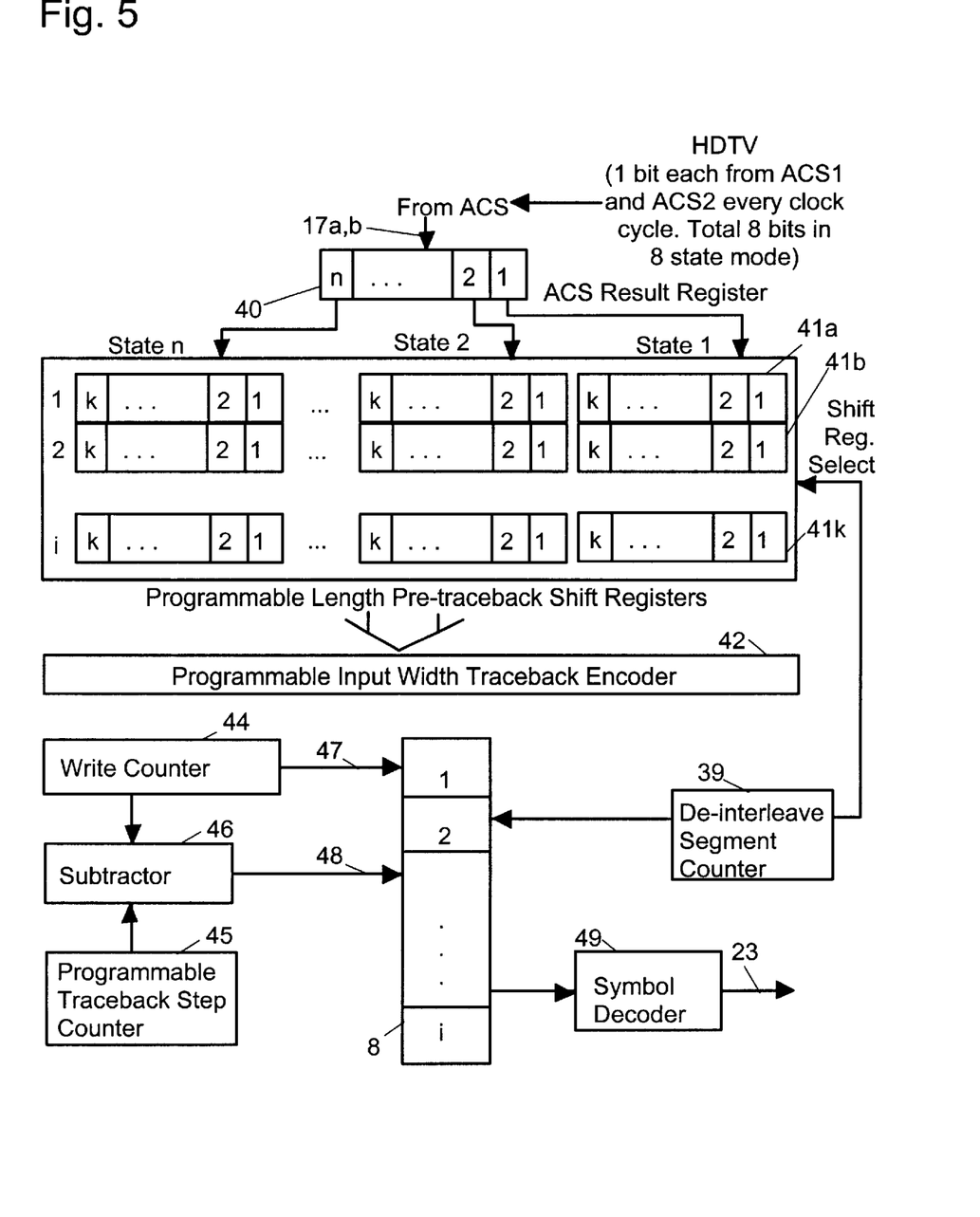
FIG. 5 shows a detail block diagram of the traceback processor of the invention showing the programmable pre-traceback depth for variable length traceback.

Referring to FIG. 5 for the details of the traceback processor 6 of FIG. 2, the ACS path metric selection results 17a–b are passed to an ACS results register 40. Only the bit that indicates the smaller of the two path metric sums is pertinent to the pre-traceback operation. The number of states and consequently the width of ACS results register is n, for which n=8 for the HDTV application. The data bits are passed from ACS results register 40 to a plurality of pre-traceback shift registers 41a–i, where i is the de-interleave depth. The values of the shift registers 41a–i to a depth k, which is fixed at k=4 for the HDTV application, are decoded in a programmable input width decoder 42. The k-depth pre-traceback values are stored in traceback memory 8.

The depth k of pre-traceback shift registers 41a–i is related to the depth of the traceback. If t is the desired traceback depth and c is the number of clock cycles in a symbol period, then k=t/c. In the HDTV application, t=16 and c=4, so that k is fixed at 4. In most designs, the value c is fixed by the application. The programmable depth of the shift register allows the designer to change k and therefore change t, the traceback depth. The desired traceback depth is related to the resultant net error rate out of the Trellis Decoder.

A write counter 44 provides a pointer 47 to create a circular buffer of traceback values for each symbol. For traceback, four traceback memory reads are performed. A traceback read address 48 is generated by a subtractor 46 subtracting values from a step counter 45, which counts by k in the general case and by 4 in this case, from the write address 47. The depth of the final traceback is therefore equal to 4 k or 16 in this case.

The SYMBOL output 23 of the traceback processor 6 is taken from a symbol decoder/sequencer 49, and becomes the output of the Trellis Decoder.

Although described in terms of video-rate decoders, it will be understood that the invention might also be used in modems, cellular phones, high definition TV (HDTV) receivers, satellite receivers, disk drive read channels, wireless LANs, or any other high rate digital transmission product Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A trellis decoder for decoding symbol data from a trellis-encoded input data stream, the data stream comprising a stream of symbols being passed once per symbol period, the decoder comprising:

a) branch metric generator means for generating branch metric values from the trellis-encoded input data stream, having an input for accepting the trellis-encoded input data stream, and a data output comprising branch metric values generated from the data on the input data stream;

b) a plurality of add/compare/select modules for computing path metric values from branch metric data, each having an input coupled to the data output of the branch metric generator, a memory connection for retrieving stored path metrics from a path metric memory and a selection output;

c) one path metric memory for each add/compare/select module, each path metric memory having a data input and an address input, and an output coupled to the memory connection of one add/compare/select module, each path metric memory comprising a plurality of storage locations addressed by the address input;

d) a shuffler having a plurality of inputs coupled to the selection outputs of the add/compare/select module and a plurality of outputs each coupled to the data input of a path metric memory, such that the selection output from the add/compare/select modules is sorted and provided to the path metric memories, and written to the storage location in the path metric memory addressed by the address input of the path metric memory; and e) a traceback processor.

2. The decoder of claim 1, wherein said traceback processor comprises:

i) a plurality of pre-traceback shift registers, each having an input connected to an add/compare/select results register, a depth and an output;

ii) decoder means for decoding the outputs of the pre-traceback shift registers, having a plurality of inputs connected to the outputs of the shift registers of the pre-traceback memory and an output;

iii) a traceback memory, comprising a plurality of addressable storage locations, a data input coupled to the output of the decoder, a read address input and a write address input, and an output, such that data appearing on the input is written to the address specified by the data on the write address input, and the data at the address specified by the data appearing on the read address input is written to the output;

iv) a write counter having a output coupled to the write address input of the traceback memory;

v) a traceback step counter having an output incremented a plurality of times per symbol period;

vi) a subtractor, having a first input coupled to the output of the write counter and a second input coupled to the output of the traceback step counter, and an output comprising the difference between the two inputs, the output of the subtractor being coupled to the read address input of the traceback memory, such that the traceback memory comprises a circular buffer of traceback values for each symbol; and vii) the output of the traceback memory comprising a symbol output which is the output of the decoder.

3. The decoder of claim 2, wherein:

there are twelve segments of the traceback memory;

there are two add/compare/select modules; and the depth of each of the pre-traceback shift registers equals 4.

4. The decoder of claim 2, further comprising:

a) the input data stream being interleaved by a preselected interleave factor;

b) the traceback memory comprising a plurality of segments, each segment comprising a plurality of storage locations addressed by the read and write address inputs of the traceback memory, the segments being selected by an address at a segment select address input, the number of segments being related to the interleave factor of the input data stream; and c) a de-interleave segment counter having an output coupled to the segment select address input of the traceback memory, the output of the de-interleave segment counter being incremented once each symbol period, such that each symbol period a separate segment of traceback memory is used, the maximum count of the de-interleave segment counter being related to the interleave factor of the input data stream.

5. The decoder of claim 4, wherein:

the interleave factor is 12:1; and the traceback memory comprises twelve segments.

6. The decoder of claim 2, in which a depth of each shift register in the pre-traceback memory is determined by dividing a desired traceback depth by a number of clock cycles in the symbol period.

7. The decoder of claim 2, in which a depth of the shift registers of the pre-traceback memory is programmable.

8. The decoder of claim 2, in which a depth of the shift registers is fixed.

9. The decoder of claim 2, in which the decoder means of the traceback processor has a programmable input width.

10. The decoder of claim 1, further comprising:
   a) the input data stream being interleaved by a preselected interleave factor;
   b) each path metric memory comprising a plurality of segments, each segment comprising a plurality of storage locations addressed by the address input of the path metric memory, the segments being selected by an address at a segment select address input, the number of segments being related to the interleave factor of the input data stream; and
   c) a de-interleave segment counter having an output coupled to the segment select address input of the path metric memories, the output of the de-interleave segment counter being incremented once each symbol period, such that each symbol period a separate segment of path metric memory is used, the maximum count of the de-interleave segment counter being related to the interleave factor of the input data stream.

11. The decoder of claim 10, in which the interleave factor is 12:1, and the path metric memories comprise twelve segments.

12. The decoder of claim 1, wherein said branch metric generator means includes a distance calculator.

13. The decoder of claim 12, wherein said distance calculator operates in a 4-state mode and includes:
   four subsets, each subset including one positive and one negative member;
   comparison means for comparing a received value to a subset slicer, wherein an output of YES is generated if said received value is greater than or equal to said subset slicer, and an output of NO is generated if said received value is less than said subset slicer;
   means, based on said comparison means, for determining a distance for each subset, wherein,
      when said output is YES, said distance equals a square of a difference between said received value and said positive member of said subset whose distance is being determined; and
      when said output is NO, said distance equals a square of a difference between said received value and said negative member of said subset whose distance is being determined.

14. The decoder of claim 12, wherein said distance calculator operates in an 8-state mode and includes:
   seven subsets, each subset including three members ranked numerically as smallest, middle, and largest;
   each subset having an upper slicer defined as an average of said middle and largest members, and a lower slicer defined as an average of said middle and smallest members;
   checking means for checking whether a sign of a received value, wherein an output of YES is generated if said received value is zero and an output of NO is generated if said received value is non-zero;
   first comparison means, responsive to said YES output of said checking means, for comparing said received value to a subset upper slicer, wherein an output of YES is generated if said received value is greater than or equal to said subset upper slicer, and an output of NO is generated if said received value is less than said subset upper slicer;
   second comparison means, responsive to said NO output of said checking means, for comparing said received value to a subset lower slicer, wherein an output of YES is generated if said received value is less than or equal to said subset lower slicer, and an output of NO is generated if said received value is greater than said subset lower slicer;
   means, based on said first and second comparison means, for determining a distance for each subset, wherein,
   when said output of said first comparison means is YES, said distance equals a square of a difference between said received value and said largest member of said subset whose distance is being determined;
   when said output of said first comparison means is NO, said distance equals a square of a difference between said received value and said middle member of said subset whose distance is being determined;
   when said output of said second comparison means is YES, said distance equals a square of a difference between said received value and said smallest member of said subset whose distance is being determined; and
   when said output of said second comparison means is NO, said distance equals a square of a difference between said received value and said middle member of said subset whose distance is being determined.

* * * * *